(12) United States Patent
Minemura et al.

(10) Patent No.: US 8,095,844 B2
(45) Date of Patent: Jan. 10, 2012

(54) DIGITAL INFORMATION REPRODUCTION METHOD

(75) Inventors: Hiroyuki Minemura, Kokubunji (JP); Toshimichi Shintani, Kodaira (JP); Yumiko Anzai, Ome (JP); Soichiro Eto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 908 days.

(21) Appl. No.: 12/153,328

(22) Filed: May 16, 2008

(65) Prior Publication Data

US 2009/0106627 A1   Apr. 23, 2009

(30) Foreign Application Priority Data

Oct. 18, 2007 (JP) ................................ 2007-271587

(51) Int. Cl.
*G06F 11/00* (2006.01)
(52) U.S. Cl. .................. 714/752; 714/758; 714/800
(58) Field of Classification Search .................. 714/752, 714/758, 800
See application file for complete search history.

(56) References Cited

U.S. PATENT DOCUMENTS

| 2005/0106508 | A1 | 5/2005 | Shintani et al. | |
| 2005/0249318 | A1 | 11/2005 | Minemura | |
| 2006/1172434 | | 4/2006 | Shintani et al. | |
| 2006/0190799 | A1* | 8/2006 | Kan et al. | 714/758 |
| 2007/0252738 | A1* | 11/2007 | Nakagawa | 341/143 |
| 2009/0067309 | A1* | 3/2009 | Kobayashi et al. | 369/59.26 |
| 2011/0202816 | A1* | 8/2011 | Lin et al. | 714/758 |

FOREIGN PATENT DOCUMENTS

| JP | 2005-100526 | 4/2005 |
| JP | 2005-346897 | 12/2005 |
| JP | 2006-107588 | 4/2006 |

OTHER PUBLICATIONS

Conference Program and Technical Digest, Optical Data Storage (ODS) Topical Meeting and Tabletop Exhibit, Benson Hotel, Portland, Oregon, USA, The International Society for Optical Engineering, Map 20-23 2007, "Novel Signal Processing Method for Super-Resolution Discs", Hiroyuki,.Minemura et al.
May 11-14, 2003 Technical Digest, Topical Meeting, Optical Data Storage, Parity Check Error Event Post-Processor for Optical Data Storage, Jingfeng Liu et al, pp. 99-100.
High-Speed Write/Read Techniques for Blu-ray Write-Once Discs, Hiroyuki Minemura et al, Japanese Journal of Applied Physics, vol. 45, No. 2B, 2006, pp. 1213-1218, 2006 The Japan Society of Applied Physics.
Kui Caj et al; "Constrained Parity-Check Code and Post-Processor for Advanced Blue Laser Disc Systems", Japanese Journal of Applied Physics, vol. 45, No. 2B, Feb. 24, 2006, pp. 1071-1078.

* cited by examiner

*Primary Examiner* — Marc Duncan
(74) *Attorney, Agent, or Firm* — Antonelli, Terry, Stout & Kraus, LLP.

(57) ABSTRACT

An optical disc using super-resolution effects that achieves higher-density recording exceeding the optical resolution suffers from the signal-quality degradation caused by the normal resolution component included in the reproduction signal. To address this problem, a data reproduction method is provided. In the method, characteristic error patterns are identified and parity check codes in conformity with run-length limited coding are used to carry out efficient and reliable error correction. Error patterns caused by the normal resolution crosstalk are localized in the leading edges of a mark following a long space and in the trailing edges of a long mark. Whether an error exists in the data is determined by use of the parity check codes. When an error occurs, a pattern in which an error is most likely to occur is selected from the above-mentioned patterns by taking account of the edge shift direction, and then the error therein is corrected.

5 Claims, 24 Drawing Sheets

Relationship between mark length and signal amplitude of CNR pattern, calculated by FDTD method at Tw=75nm condition.

FIG. 5

Conditions:
Code=17PP
T=50nm
White Noise=-20dB
NR Disk Noise=-20dB
NRCT=+9dB
NR Delay=-1T

| Class | Eye-Pattern |
|---|---|
| Raw Signal | |
| PR(1,2,1) | |
| PR(1,2,2,1) | |
| PR(1,2,2,2,1) | |

FIG. 6

Conditions:
Code=17PP
T=50nm
White Noise=-20dB
NR Disk Noise=-20dB
NRCT=+9dB
NR Delay=-1T
Class=PR(1,2,1)ML

| Error Pattern | Error Pattern Rate | | |
|---|---|---|---|
| | NRCT=+6dB | NRCT=+9dB | NRCT=+12dB |
| { + }, { - } | - | 1.00 | 1.00 |
| { +0- } { -0+ } | - | - | - |
| { +00- } { -00+ } | - | - | - |
| Others | - | - | - |
| bit error rate | - | $3.1 \times 10^{-5}$ | $3.3 \times 10^{-2}$ |

FIG. 7

Conditions:
Code=17PP
T=50nm
White Noise=-20dB
NR Disk Noise=-20dB
NRCT=+9dB
NR Delay=-1T
Class=PR(1,2,2,1)ML

| Error Pattern | Error Pattern Rate | | |
|---|---|---|---|
| | NRCT=+6dB | NRCT=+9dB | NRCT=+12dB |
| { + }, { - } | 1.00 | 1.00 | 0.9855 |
| { +0- } { -0+ } | - | - | 0.0145 |
| { +00- } { -00+ } | - | - | - |
| Others | - | - | - |
| bit error rate | $4.3 \times 10^{-4}$ | $2.7 \times 10^{-2}$ | $5.8 \times 10^{-2}$ |

FIG. 8

Conditions:
Code=17PP
T=50nm
White Noise=-20dB
NR Disk Noise=-20dB
NRCT=+9dB
NR Delay=-1T
Class=PR(1,2,2,2,1)ML

| Error Pattern | Error Pattern Rate | | |
|---|---|---|---|
| | NRCT=+6dB | NRCT=+9dB | NRCT=+12dB |
| { + }, { - } | 1.00 | 0.9941 | 0.6525 |
| { +0- } { -0+ } | - | 0.0036 | 0.1803 |
| { +00- } { -00+ } | - | 0.0023 | 0.1672 |
| Others | - | - | - |
| bit error rate | $2.3 \times 10^{-4}$ | $1.9 \times 10^{-2}$ | $8.9 \times 10^{-2}$ |

Conditions:
Code=17PP
T=50nm
White Noise=-20dB
NR Disk Noise=-20dB
NRCT=+9dB
NR Delay=-1T

| Class | Eye-Pattern |
|---|---|
| PR(1,2,2,1) |  |
| PR(1,3,3,1) |  |
| PR(1,4,4,1) |  |
| PR(1,5,5,1) |  |

FIG. 10

Conditions:
Code=17PP
T=50nm
White Noise=-20dB
NR Disk Noise=-20dB
NRCT=+9dB
NR Delay=-1T

| PR Class | bit error rate | | |
|---|---|---|---|
| | NRCT=+6dB | NRCT=+9dB | NRCT=+12dB |
| PR(1,2,2,1)ML | $2.3 \times 10^{-4}$ | $1.9 \times 10^{-2}$ | $8.9 \times 10^{-2}$ |
| PR(1,3,3,1)ML | - | $2.6 \times 10^{-2}$ | $5.3 \times 10^{-2}$ |
| PR(1,4,4,1)ML | - | $2.1 \times 10^{-2}$ | $5.0 \times 10^{-2}$ |
| PR(1,5,5,1)ML | - | $4.7 \times 10^{-2}$ | $4.8 \times 10^{-2}$ |

FIG. 12

Leading Edge

|  | m=2 | m=3 | m=4 | m≧5 |
|---|---|---|---|---|
| s=2 | 21791 | 13611 | 8258 | 15045 |
| s=3 | 15826 | 8746 | 4800 | 5160 |
| s=4 | 7560 | 3812 | 1500 | 3508 |
| s≧5 | 7560 | 8465 | 2182 | 7959 |

Trailing Edge

|  | m=2 | m=3 | m=4 | m≧5 |
|---|---|---|---|---|
| s=2 | 21508 | 15838 | 7802 | 13559 |
| s=3 | 13722 | 8857 | 3904 | 8049 |
| s=4 | 8097 | 4784 | 1425 | 2074 |
| s≧5 | 15557 | 5155 | 3610 | 7990 |

FIG. 13

Conditions:
Code=17PP
T=50nm
White Noise=-20dB
NR Disk Noise=-20dB
NRCT=+9dB
NR Delay=-1T
Class=PR(1,2,1)

Leading Edge

|  | m=2 | m=3 | m=4 | m≧5 |
|---|---|---|---|---|
| s=2 | 0 | 0 | 0 | 0 |
| s=3 | 0 | 0 | 0 | 0 |
| s=4 | 0 | 0 | 0 | 0 |
| s≧5 | 0 | 0.0006 | 0.0025 | 0.0001 |

Left-Shift Error

Trailing Edge

|  | m=2 | m=3 | m=4 | m≧5 |
|---|---|---|---|---|
| s=2 | 0 | 0 | 0 | 0 |
| s=3 | 0 | 0 | 0 | 0.0001 |
| s=4 | 0 | 0 | 0 | 0.0031 |
| s≧5 | 0 | 0 | 0 | 0.0002 |

|  | m=2 | m=3 | m=4 | m≧5 |
|---|---|---|---|---|
| s=2 | 0 | 0 | 0 | 0 |
| s=3 | 0 | 0 | 0 | 0 |
| s=4 | 0 | 0 | 0 | 0 |
| s≧5 | 0 | 0 | 0 | 0 |

Right-Shift Error

|  | m=2 | m=3 | m=4 | m≧5 |
|---|---|---|---|---|
| s=2 | 0 | 0 | 0 | 0 |
| s=3 | 0 | 0 | 0 | 0 |
| s=4 | 0 | 0 | 0 | 0 |
| s≧5 | 0 | 0 | 0 | 0 |

FIG. 14

Conditions:
Code=17PP
T=50nm
White Noise=-20dB
NR Disk Noise=-20dB
NRCT=+9dB
NR Delay=-1T
Class=PR(1,2,2,1)

Leading Edge

Left-Shift Error

|  | m=2 | m=3 | m=4 | m≧5 |
|---|---|---|---|---|
| s=2 | 0 | 0 | 0 | 0 |
| s=3 | 0 | 0 | 0 | 0 |
| s=4 | 0 | 0 | 0.0007 | 0.0337 |
| s≧5 | 0 | 0.5197 | 0.8435 | 0.8781 |

Trailing Edge

|  | m=2 | m=3 | m=4 | m≧5 |
|---|---|---|---|---|
| s=2 | 0 | 0 | 0 | 0 |
| s=3 | 0 | 0 | 0 | 0.4461 |
| s=4 | 0 | 0 | 0 | 0.8766 |
| s≧5 | 0 | 0 | 0.0183 | 0.8426 |

Right-Shift Error

|  | m=2 | m=3 | m=4 | m≧5 |
|---|---|---|---|---|
| s=2 | 0 | 0 | 0 | 0 |
| s=3 | 0 | 0 | 0 | 0 |
| s=4 | 0 | 0 | 0 | 0 |
| s≧5 | 0 | 0 | 0 | 0 |

|  | m=2 | m=3 | m=4 | m≧5 |
|---|---|---|---|---|
| s=2 | 0 | 0 | 0 | 0 |
| s=3 | 0 | 0 | 0 | 0 |
| s=4 | 0 | 0 | 0 | 0 |
| s≧5 | 0 | 0 | 0 | 0 |

FIG. 15

Conditions:
Code=17PP
T=50nm
White Noise=-20dB
NR Disk Noise=-20dB
NRCT=+9dB
NR Delay=-1T
Class=PR(1,2,2,2,1)

Leading Edge

Left-Shift Error

|  | m=2 | m=3 | m=4 | m≧5 |
|---|---|---|---|---|
| s=2 | 0.0021 | 0.0001 | 0 | 0.0011 |
| s=3 | 0 | 0 | 0 | 0.0029 |
| s=4 | 0 | 0 | 0 | 0.1046 |
| s≧5 | 0.0009 | 0.0141 | 0.5451 | 0.8135 |

Trailing Edge

|  | m=2 | m=3 | m=4 | m≧5 |
|---|---|---|---|---|
| s=2 | 0.0012 | 0 | 0 | 0.0023 |
| s=3 | 0 | 0 | 0 | 0.0207 |
| s=4 | 0 | 0 | 0 | 0.6596 |
| s≧5 | 0.0024 | 0.0021 | 0.1796 | 0.8491 |

Right-Shift Error

|  | m=2 | m=3 | m=4 | m≧5 |
|---|---|---|---|---|
| s=2 | 0 | 0 | 0 | 0 |
| s=3 | 0 | 0 | 0 | 0 |
| s=4 | 0 | 0 | 0 | 0 |
| s≧5 | 0 | 0 | 0 | 0 |

|  | m=2 | m=3 | m=4 | m≧5 |
|---|---|---|---|---|
| s=2 | 0 | 0 | 0 | 0 |
| s=3 | 0 | 0 | 0 | 0 |
| s=4 | 0 | 0 | 0 | 0 |
| s≧5 | 0 | 0 | 0 | 0 |

Data Block

Data Block with Parity

Parity Pattern for RLL(1,7) Code

Parameter a vs. Euclidean Distance

Euclidean Distance vs. Bit Error Rate

DIGITAL INFORMATION REPRODUCTION METHOD

CLAIM OF PRIORITY

The present application claims priority from Japanese application JP 2007-271587 filed on Oct. 18, 2007, the content of which is hereby incorporated by reference into this application.

BACKGROUND OF THE INVENTION

1. Field of the Invention

The present invention relates to a digital information reproduction method of reproducing information from an optical disc medium having information recorded thereon by forming a record mark on the recording medium, the recording mark having a different physical property from the rest of the recording medium.

2. Description of the Related Art

Various types of optical disc media exist, such as CD-R/RWs, DVD-RAMs, DVD±R/RWs, Blu-ray Discs (hereafter simply mentioned as BDs) and HD DVDs. These optical disc media including those that have dual data layers are widely used for general purposes. An optical disc apparatus which is widely used and which supports these optical disc media is a so-called DVD super multi drive, which is capable of performing the recording/reproduction using CD-R/RWs, DVD-RAMs and DVD±R/RWs. More advanced drives supporting BDs or HD DVDs are expected to be popular in the foreseeable future.

Some of the already-proposed technologies related to the next-generation large-capacity optical discs include the super-resolution technique and the solid immersion lens (SIL). An example of the super-resolution technique is disclosed in the Japanese Patent Application Publication No. 2006-107588. According to the disclosed technique, the super-resolution reproduction is performed using phase-change recording films buried in pits. The phase-change recording film used here changes its optical properties when the film is melted. In addition, record marks are spatially-separated from one another to reduce the thermal interference between the record marks and to reduce fluctuation of the super-resolution region. According to this configuration, higher line density and higher track density can be obtained so that a significant increase in the recording capacity of the optical disc can be achieved. Moreover, larger transmittance in regions between data pits contributes to larger average transmittance of all over the data surface. Accordingly, higher light-use efficiency can be obtained. The discs thus configured are advantageous when the discs are made as a multi-layer disc. Hereinafter, the above-described type of disc will be called a three-dimensional pit selection type. One of the means available for the purpose of burying recording films in pits is a phase-change etching method (a method utilizing the difference in the etching speed between a crystalline material and an amorphous material) described in Japanese Patent Application Publication No. 2005-100526. Another available method for this purpose is a physical polishing processing method, such as the chemical mechanical polishing (CMP) method.

Technical Digest of Optical Data Storage 2007, TuC3 reports that the reproduction signal of super-resolution discs includes super-resolution signal components and normal resolution signal components. This document proposes a simulation method and a Viterbi decoding method utilizing the difference in bands between the two kinds of signal components.

Meanwhile, the reproduction of information from optical disc media including super-resolution discs inevitably involves a possible occurrence of errors in the digital data from one reason to another. One of the frequently-used methods of correcting these errors is the one using the error correcting codes, as represented by Reed-Solomon codes. In the Reed-Solomon correction, digital data is treated as symbol values by the byte, for example. Accordingly, as has been known widely, the Reed-Solomon codes are well-suited to applications where burst errors occur. Nevertheless, the error correction using the Reed-Solomon codes is performed for each symbol, so that the efficient error correction cannot be conducted by this method in a case where errors occur in the optical disc medium for a certain bit pattern with disproportionately high frequency. One of the error correction methods that are well-suited to application to such a case where errors are concentrated on a certain bit pattern is a method using parity check bits, and Technical Digest of Optical Data Storage 2003, TuB4 describes an example of such a method.

When it comes to the Viterbi decoding method, which the present invention focuses on, Japanese Journal of Applied Physics Vol. 45, No. 2B, 2006, pp. 1213-1218, describes a method of calculating edge shift amounts for all the edge patterns in accordance with run-length limited coding.

SUMMARY OF THE INVENTION

Technical Digest of Optical Data Storage 2003, TuB4 deals with codes without run-length limited coding (the shortest length=1 T). When an error in which the NRZ bit {0,1,0,0,1,0} is replaced with NRZ bit {1,1,0,0,0,0}, the error pattern is expressed as {+000-0} by the parity check codes in Technical Digest of Optical Data Storage 2003, TuB4. The report concludes that the pattern having the highest error probability is {+-+-} or {-+-+}.

As shown below, the error patterns that occur in the reproduction signals of a super-resolution disc were studied based on a simulation method described in Technical Digest of Optical Data Storage 2007, TuC3, using run-length limited coding (the shortest length=2 T), which are used for the Blu-ray Disc. The study revealed the existence of an error pattern that was peculiar to the case. The error pattern was localized in the leading edge of a long mark and in the trailing edge of a mark following a long space. In addition, the direction of the edge shift was unique. Now, let the results be expressed in accordance with the way described in Technical Digest of Optical Data Storage 2003, TuB4, and we obtain {+} or {-}. This is an error pattern that is clearly different from what was reported. Moreover, since the codes used in Technical Digest of Optical Data Storage 2003, TuB4 are not run-length limited, any bit strings can be used as the parity check codes. In contrast, in order to use the parity check codes for the run-length limited codes RLL (1,7), which is widely used for the Blu-ray Disc and the like, it is required that the parity check codes be also run-length limited.

As has been described thus far, the challenges to be solved by the present invention are to find out the error pattern corresponding to a super-resolution disc that employs run-length limited coding, and to provide parity check codes in conformity with rules for run-length limited coding. Through the solving of these challenges, a reduction in the signal error for the super-resolution disc and an improvement in the reliability for the disc can be achieved. These are some of the objects that the present invention has.

Now, descriptions will be given concerning the peculiarity of the error pattern for the three-dimensional pit selection type super-resolution disc.

FIG. 2 is a schematic diagram of a reproduction signal of the three-dimensional pit selection type super-resolution disc. FIG. 2 shows that the mark that is smaller than the optical resolution has zero amplitude for the normal resolution signal component, while large signal amplitude can be obtained from a mark that is smaller than the optical resolution for the super-resolution signal component. The signal at the reproduction of the super-resolution disc is obtained by adding the two kinds of signal components together. On the other hand, in the case of a medium that obtains the super-resolution effects by use of the thermal energy, such as a three-dimensional pit selection type disc, a delay that is equivalent to the delay influenced by thermal response occurs in the super-resolution signal (the delay caused as such is indicated by Δ in FIG. 2, and will be hereafter called NR_Delay). Favorable reproduction of data is nearly impossible from a reproduction signal obtained by adding together two signals that differ from each other both in their amplitudes and in their phases. Here, a focus on the super-resolution signal allows us to regard the normal resolution signal as a crosstalk. Now, suppose that the amplitude of the super-resolution signal is Ss and the amplitude of the normal resolution signal is Sn. Then, the ratio of the amplitude Sn/Ss will be called the normal resolution crosstalk (NRCT).

An electromagnetic computation was carried out by the finite differential time domain (FDTD) method in order to examine the mark-length dependency of the signal amplitude for the super-resolution signal and for the normal resolution signal. The disc structure employed for the purpose was the one shown in Technical Digest of Optical Data Storage 2007, TuC3. In accordance with a model that the phase-change recording films in the record marks that are closest to the center of the beam spot are uniformly melted, the amplitude of the reproduction signal in a high-power case (super-resolution signal component+normal resolution signal component) was obtained. In addition, on the assumption that all the record marks are in the crystalline phase, the amplitude of the reproduction signal in a low-power case (normal resolution signal component) was obtained. FIG. 3 shows the calculation results of the relationship between the mark length and the signal amplitude of a repeated signal. The amplitude of the super-resolution signal shown in FIG. 3 was obtained by subtracting the reproduction signal at the low-power case from the reproduction signal at the high-power case. When RLL (1, 7) modulation codes were used, a shortest mark length (2 T) of 150 nm allowed a disc of 120 mm diameter to have an approximately 25 GB recording capacity. On the other hand, the use of a three-dimensional pit selection type disc allowed a 100-GB capacity, which is four times larger than what was obtained in the previous case. To put it other way, even the shortest mark length of 37.5 nm allowed amplitude of 2 T signal. Here, in this case, the longest mark 8 T had a mark length of 150 nm. In addition, at the mark length of 150 nm, the amplitude of the normal resolution signal was larger than that of the super-resolution signal by approximately 6 dB.

The FDTD method cannot be employed to calculate the bit-error rate from a code data signal with a length of more than a million-T length, that is, a random pattern signal, because of the problems related to the time needed for the calculation and to the memory. Now, a calculation is performed from a random pattern signal in accordance with the calculation method described in Technical Digest of Optical Data Storage 2007, TuC3. For the normal resolution signal, the random pattern reproduction signal can be calculated by obtaining the impulse response through a well-known linear diffraction calculation and then by performing a convolution operation of the impulse response and the binary data string of the RLL (1, 7) codes. For the super-resolution signal, the reproduction signal can be calculated by a calculation model shown in FIG. 4. Here, assume that melting occurs in a region where a region located near the center of the beam spot and having a high intensity (radius=Rm) overlaps record marks, and that the region in the molten state has a different reflectance from that of other locations. The super-resolution signal component is calculated by integrating the intensity distribution of the beam spot approximated by a Gaussian distribution and the reflectance response for the molten-state region.

The Viterbi decoding method brings about an effective improvement in the S/N ratio of the reproduction signal. This excellent binarization method is widely put into practical usage in optical disc apparatus, HDDs and the like. In the Viterbi decoding method, the target signal is obtained by a convolution operation of a binarized bit string on the basis of the impulse response defined by the PR classes. The binarized value is determined by selecting, as the most probable one, one of all the binarized bit strings that gives the closest target signal to the reproduction signal. For this reason, what is desired in the Viterbi decoding method is a selection of a PR class by which a target signal that is close to the reproduction signal is likely to be obtained. Note that, as described above, the reproduction signal from a super-resolution disc includes the super-resolution signal component that has a higher resolution, and the normal resolution signal component that has a lower resolution. The proportion of the two components is determined by the normal resolution crosstalk amount, that is, NRCT value. The NRCT value is increased or decreased by factors, such as the fluctuation in the reproduction power, defocusing, and unevenness in sensitivity of the medium. Accordingly, the PR class of the Viterbi decoding method employed for a super-resolution disc has to be selected so as to allow a favorable bit-error rate for the NRCT values of a range that is as broad as possible. Note that, when the NRCT value changes, the form of the reproduction signal changes as well. For this reason, a preferable PR class for a super-resolution disc is found out by comparing various PR classes.

FIG. 5 shows the calculation results of a random pattern signal. The optical system used here was the one for the Blu-ray Disc. In addition, the wavelength was 405 nm, and the numerical aperture was 0.85. The codes used here were the 17PP codes, which are also used for the Blu-ray Disc. The detection window had a width T=50 nm (which is equivalent to a capacity of 35 GB). The white noise, such as the laser noise, was set at −20 dB which is the amplitude of the super-resolution signal while the disc noise that appears in the normal resolution signal was set at −20 dB. The normal resolution crosstalk NRCT was set at +9 dB while the phase delay of the normal resolution signal NR-Delay was set at −1 T. FIG. 5 shows a raw signal of a random pattern as well as signals reproduced by Viterbi decoders, equipped with a 15-Tap automatic equalizer, of PR (1, 2, 1), PR (1, 2, 2, 1), and PR (1, 2, 2, 2, 1) classes. FIG. 5 clearly shows the signals are automatically equalized for each PR class.

FIG. 6 summarizes the patterns and the frequency for the occurrence of bit errors for PR (1, 2, 1) class in the cases where the NRCT values are set at +6 dB, +9 dB, and +12 dB, respectively. In FIG. 6 the patterns are expressed in accordance with the way described in Technical Digest of Optical Data Storage 2003, TuB4. FIG. 6 demonstrates that, as the NRCT value increases, the bit-error rate also increases, and that, on the other hand, the error patterns are localized unevenly in {+} or {−}, which represents an edge shift.

FIG. 7 and FIG. 8 summarize, likewise, the results of the patterns and the frequency for PR (1, 2, 2, 1) class and PR (1, 2, 2, 2, 1) class, respectively. The respective figures show that as the NRCT value increases, bit error occurs for the patterns other than that of {+} or {−}, and that the error pattern that has the largest frequency is {+} or {−}, which represents an edge shift.

FIG. 9 summarizes, as in the case of FIG. 5, the results for PR (1, 2, 2, 1) class, PR (1, 3, 3, 1) class, PR (1, 4, 4, 1) class, and PR (1, 5, 5, 1) class, respectively. FIG. 9 demonstrates that, according to the change in PR classes, the automatic equalization was performed so as to make the resolution of the 2 T signal larger for the class shown at a lower position in FIG. 9 than for the class shown at an upper position.

FIG. 10 summarizes the bit-error rates for PR (1, 2, 2, 1) class, PR (1, 3, 3, 1) class, PR (1, 4, 4, 1) class, and PR (1, 5, 5, 1) class in the cases where the NRCT values are set at +6 dB, +9 dB, and +12 dB, respectively. The correction limit for a random bit error in the case of the Reed-Solomon correcting codes employed for a general optical disc is a bit-error rate of $10^{-4}$, approximately. As FIG. 10 shows, whichever class was employed, the bit-error rate was not less than $10^{-2}$ in each of the cases where NRCT value was set at +9 dB. This means that the error correction is impossible and that a reproduction error takes place for these cases.

FIG. 11 shows the relationship between the NRCT value and the bit-error rate for each of the PR classes mentioned above. The values for the width of the detection window, the white noise, the disc noise, and the NR delay are the same as those described above. FIG. 11 shows that when the NRCT value was in a range from 6 dB to 9 dB, the bit-error rate exceeded $10^{-4}$ for all of the class. Of all the PR classes examined here, PR (1, 2, 1) had the smallest bit-error rate, followed by PR (1, 5, 5, 1) class, PR (1, 4, 4, 1) class, PR (1, 3, 3, 1) class, PR (1, 2, 2, 1) class, PR (1, 2, 2, 2, 1) class in this order. As shown in FIG. 5 and FIG. 9, this order coincides with the order of the magnitude of the resolution for the 2 T signal from the largest one downwards. One of the possible explanations for this is that, as the frequencies of the error patterns shown in FIG. 6 to FIG. 8 indicate, the dominant error pattern caused by the influence of the normal resolution signal that has different resolutions and shifts is edge shift. In addition, in the case of the PR classes with a larger resolution for the 2 T signal, such as PR (1, 2, 1) class and PR (1, 5, 5, 1) class, the difference between the edge portion and the target signal level in front of and behind the edge portion is large. Accordingly, errors caused by edge shifts are unlikely to occur in these cases. In other words, in the case of a reproduction signal for which error patterns are localized in edge shifts, a larger relative Euclidean distance for one edge shift makes an error unlikely to take place.

What was made clear in the above descriptions is that the edge shift is the dominant error pattern for the reproduction signal of a super-resolution disc employing run-length limited codes. The use of error correcting codes of the Reed-Solomon type results in an inefficient performance to correct the bit errors of this kind. The reason is as follows. As has been described above, when the error correcting codes of the Reed-Solomon type are employed, the decoding of the codes with their respective run-lengths limited is followed by an arithmetic operation with symbols for the byte (all the ordinary optical discs are subject to this procedure). In this event, the processing to release the interleaving is usually performed simultaneously. Accordingly, when the error correction processing of the Reed-Solomon type is performed, the information of the patterns with marks or spaces consecutively formed on the optical disc has already been erased. What is preferable in this case is the use of the parity check codes described in Technical Digest of Optical Data Storage 2003, TuB4. In the error correction processing using the parity check codes, the matching is checked between the results of arithmetic operation on the data and the results expressed by the corresponding parity check codes. Then, in a case where a mismatch occurs, a correction processing can be performed by extracting the patterns of high error frequencies from the data.

More detailed description of the way how to select the data patterns and of the actual examples of the parity check codes in conformity with run-length limited coding will be given by way of an embodiment of the present invention.

According to the digital information reproduction method of the present invention, when the data is reproduced from a super-resolution disc, such as that of the three-dimensional pit selection type, efficient bit-error correction can be carried out in accordance with the frequency of error occurrence.

BRIEF DESCRIPTION OF THE DRAWINGS

FIG. 5 is a diagram showing waveforms of a reproduction signal of a super-resolution disc that has been subjected to a processing by a Viterbi decoder.

FIG. 6 is a diagram showing simulation results of the error patterns for a super-resolution disc.

FIG. 7 is a diagram showing simulation results of the error patterns for the super-resolution disc.

FIG. 8 is a diagram showing simulation results of the error patterns for the super-resolution disc.

FIG. 10 is a diagram showing simulation results of the bit errors for a super-resolution disc.

FIG. 12 is a diagram showing the numbers of respective patterns included in the data used for the calculation.

FIG. 13 is a diagram of calculation results showing bit-error patterns and directions of edge shifts for a super-resolution disc.

FIG. 14 is a diagram of calculation results showing bit-error patterns and directions of edge shifts for the super-resolution disc.

FIG. 15 is a diagram of calculation results showing bit-error patterns and directions of edge shifts for the super-resolution disc.

DESCRIPTION OF THE PREFERRED EMBODIMENTS

Figure 1:
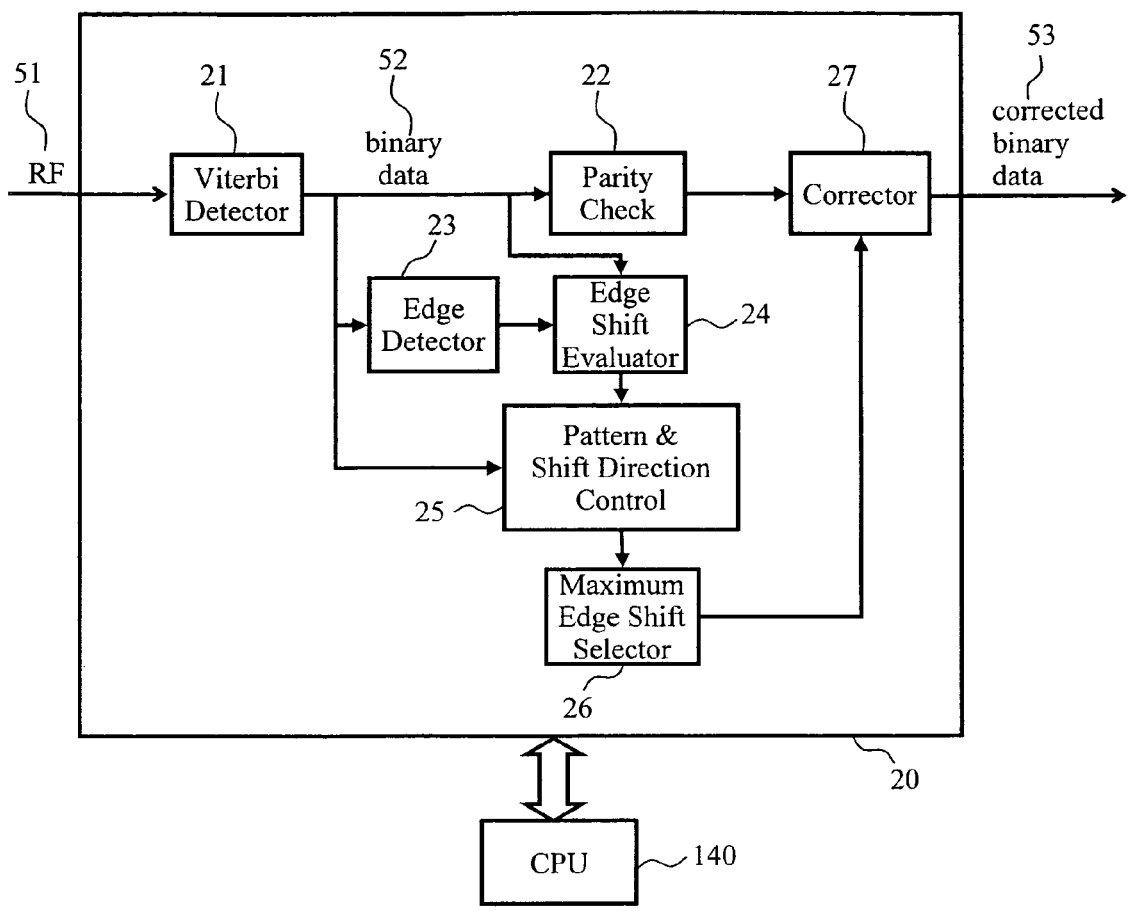
FIG. 1 is a block diagram showing the configuration of a circuit to materialize a digital information reproduction method of the present invention.
Figure 2:
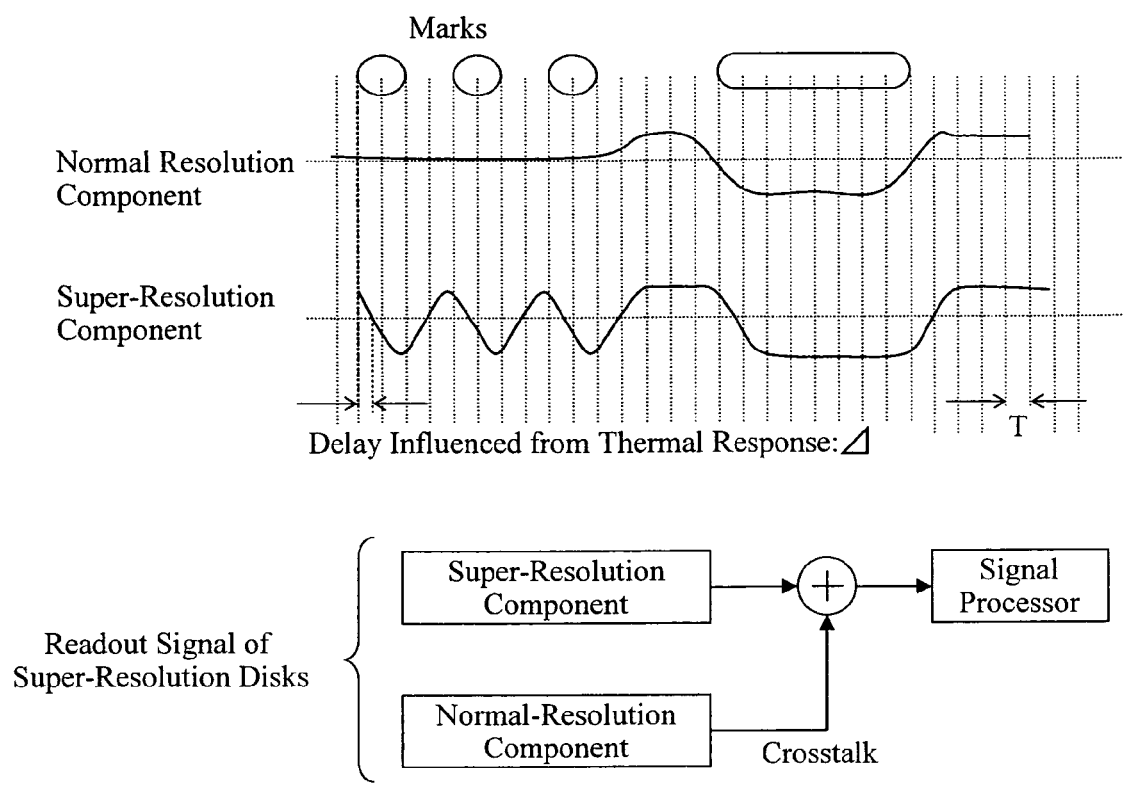
FIG. 2 is a schematic diagram showing a reproduction signal of a super-resolution disc.
Figure 3:
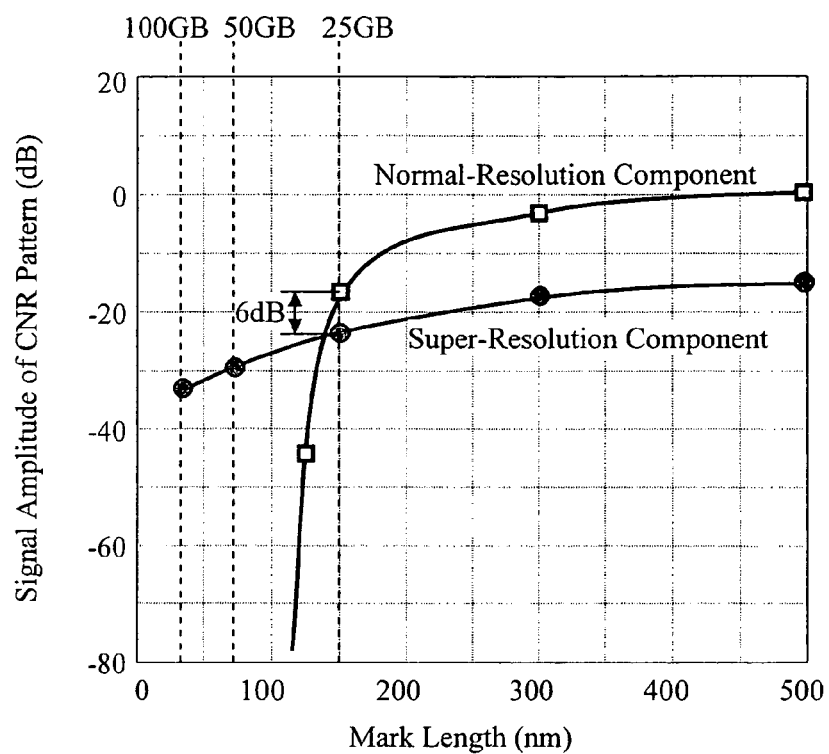
FIG. 3 is a diagram showing the results of a calculation by the FDTD method for the relationship between the mark length and the signal amplitude of a repeated signal.

More detailed contents of the technique to materialize a digital information reproduction method of the present invention will be described below by way of embodiments. The contents include (1) details of error patterns, (2) provision of parity check codes in conformity with run-length limited coding, (3) details of a reproduction processing procedure and of a circuit configuration, (4) demonstration of the effects of an error correction method using the parity check codes of the present invention.

Firstly, detailed descriptions will be given of error patterns.

FIG. 12 shows details of recording data patterns used for the simulation. The data is equivalent to user data of 64 kB in accordance with 17 PP modulation. Hereafter, a record mark or a pit physically formed on the optical disc will be represented by a digital value "1" while a space portion will be represented by a digital value "0." FIG. 12 summarizes the numbers of respective patterns included in the data for the leading edges and the trailing edges of the record marks. For the leading edges of the record marks, while the length of each of the record marks is represented by m, and the length of the space preceding each record mark is represented by s, 16 cases where each of m and s is 2 T, 3 T, 4 T, and 5 T or longer are shown in FIG. 12. Likewise, for the trailing edges of the record marks, while the length of each of the record marks is represented by m and the length of the space that follows is represented by s, 16 cases classified in the same way as the cases for the leading edges are shown in FIG. 12. In this way, all the edges can be expressed as shown in FIG. 12.

FIG. 13 shows simulation results of the frequency with which bit errors occur when PR (1, 2, 1) class is employed. The results shown in FIG. 13 are classified into the patterns shown in FIG. 12. The calculation is performed on the same conditions that are employed in the above-described case. The optical system used here is an optical system for the Blu-ray Disc. In addition, the wavelength is 405 nm, and the numerical aperture is 0.85. The codes used here are the 17 PP codes, which are used for the Blu-ray Disc. The detection window has a width T=50 nm. The white noise, such as the laser noise, is set at −20 dB while the disc noise is set at −20 dB. The normal resolution crosstalk NRCT is set at +9 dB while the phase delay of the normal resolution signal NR-Delay is set at −1 T. The errors shown in FIG. 13 are classified into two different cases—one case of errors each of which is caused by the shifting of the leading or the trailing edge of the recording mark to the left-hand side (shifting forward in temporal terms) and another case of errors each of which is caused by the shifting of the leading or the trailing edge of the recording mark to the right-hand side (shifting backward in temporal terms). The error frequencies are shown here on the basis of recording patterns. The error frequencies are the ratio of occurrence of errors to all the patterns shown in FIG. 12.

For the patterns shown by hatching in FIG. 13, that is, both in the cases where the space preceding each of the recording marks is 5 T or longer for the leading edges of the record marks and where each of the recording marks is 5 T or longer for the trailing edges of the record marks, the errors observed are only those caused by the shifting of the edge to the left-hand side. In these error patterns, the direction of the edge shift is the same direction in which the phase delay occurs for the normal resolution signal. This is probably because of a strong influence of the normal resolution signal, as the intersymbol interference becomes stronger for a record mark following a long space and for a space following a long record mark. In the present invention, only a part of the error patterns are focused upon as described above, and the direction of the edge shift is limited. As a consequence, the selection of error patterns can be performed with high accuracy.

FIG. 14 and FIG. 15 show the respective results of calculations, that are similar to the one performed in the case of FIG. 13, for PR (1, 2, 2, 1) class and for PR (1, 2, 2, 2, 1) class, respectively. The results in the case of PR (1, 2, 2, 1) class (shown in FIG. 14) are just as those in the case shown in FIG. 13. Specifically, the dominant error patterns are those with the respective preceding spaces of 5 T or longer for the leading edges of the record marks while those with the respective record marks of 5 T or longer for the trailing edges of the record marks. For both kinds of edges, the error is caused by the shifting of the edge to the left-hand side. On the other hand, in the results in the case of PR (1, 2, 2, 2, 1) class (shown in FIG. 15), occurrence of bit errors can be observed for more patterns. Nevertheless, relatively few dominant patterns are observed for the occurrence of bit errors. In addition, the shifting of the edge to the left-hand side occurs as in the case where other PR classes are employed.

Figure 22A:
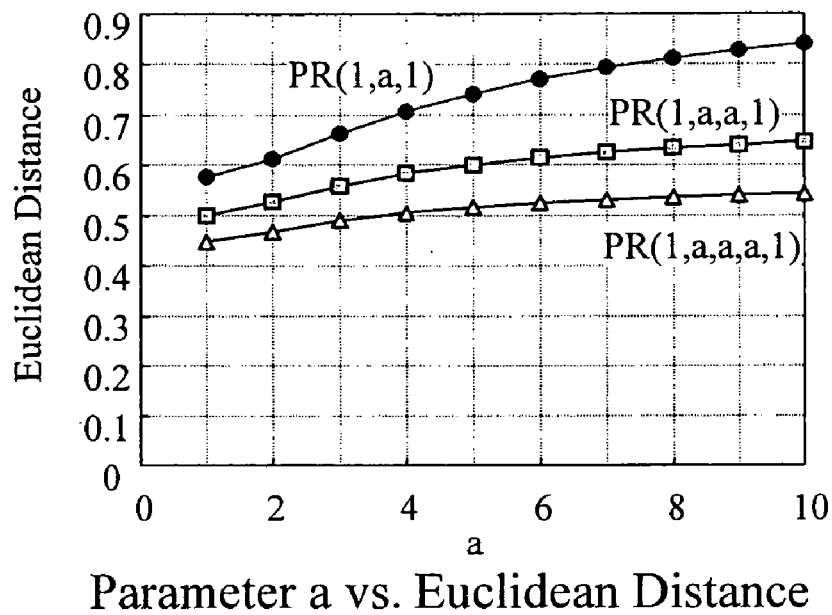
FIGS. 22A and 22B are diagrams showing the relationship between either PR classes or bit-error rates and the Euclidean distances.
Figure 22B:
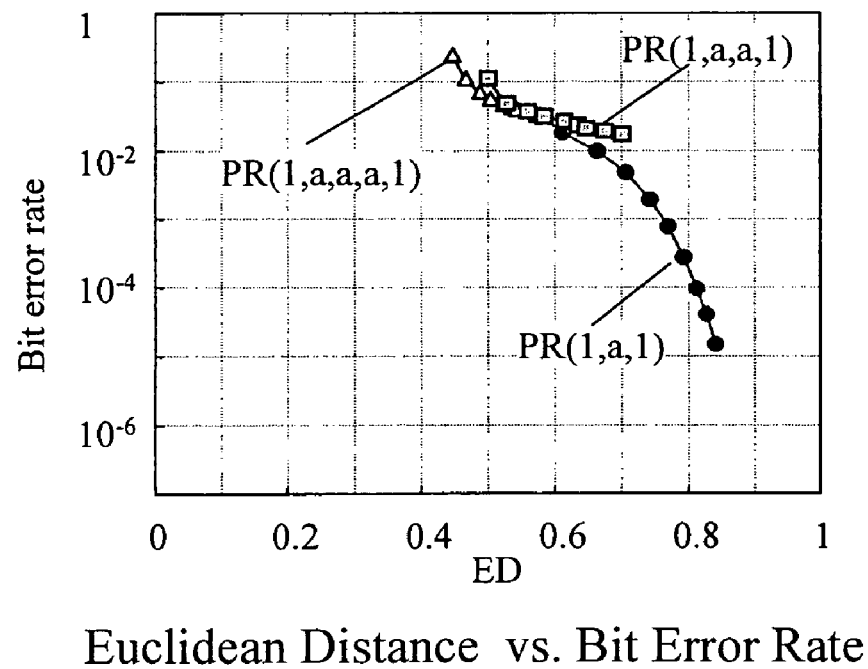

The differences in the bit-error rates and in the occurrence patterns between these PR classes mainly derive from the differences in the Euclidean distances for edge shifts. FIGS. 22A and 22B show the relationship between either the PR classes or the bit-error rates, and the Euclidean distances for edge shifts. Here, while the parameter representing the PR classes is a, comparisons are made for PR (1, a, 1) classes, PR (1, a, a, 1) classes, and PR (1, a, a, a, 1) classes, respectively. FIG. 22A shows the relationship between the parameters a and the Euclidean distances for edge shifts. FIG. 22B shows the results of calculating the relationship between the Euclidean distances and the bit-error rates. As shown in FIG. 22B, the larger the Euclidean distance is, the smaller the bit-error rate becomes, irrespective of the class. This result reflects the fact that since the bit errors for the super-resolution disc are localized in edge shifts, a larger Euclidean distance for the edge shift makes the error rate smaller.

Figure 4:
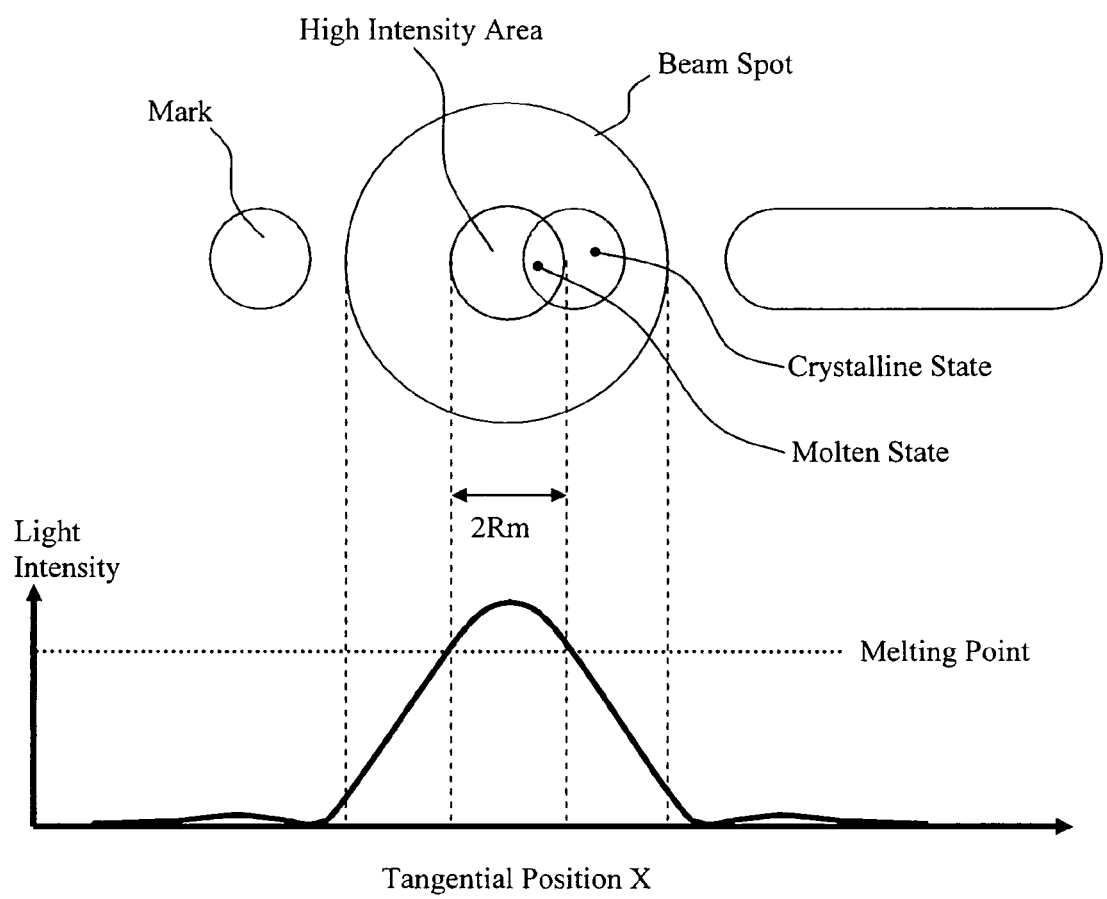
FIG. 4 is a diagram showing a model of an optical computation for an optical disc medium of the present invention.
Figure 9:
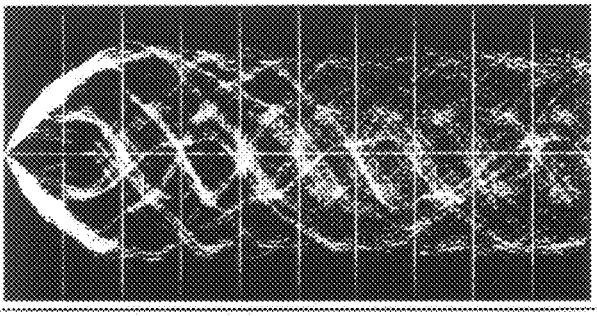
FIG. 9 is a diagram showing waveforms of a reproduction signal of a super-resolution disc that has been subjected to a processing by a Viterbi decoder.
Figure 9:
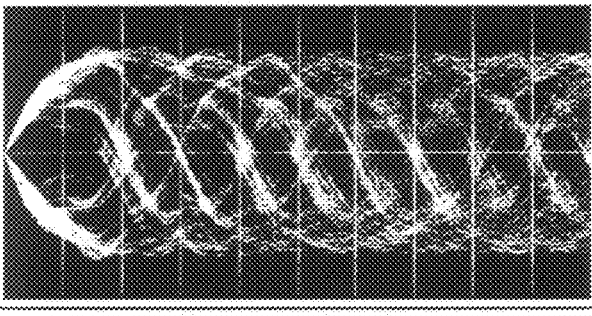
Figure 9:
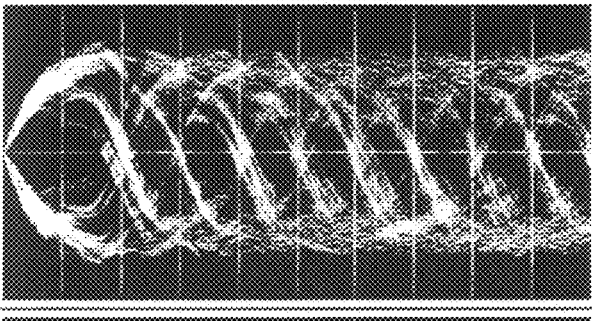
Figure 9:
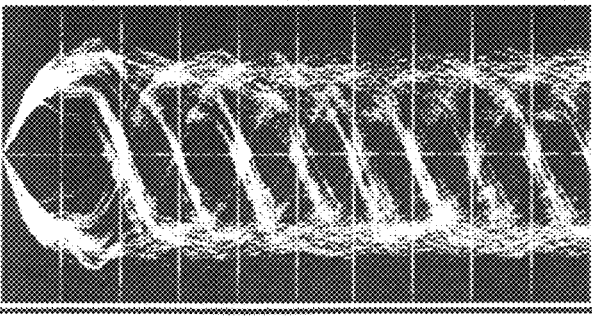
Figure 11:
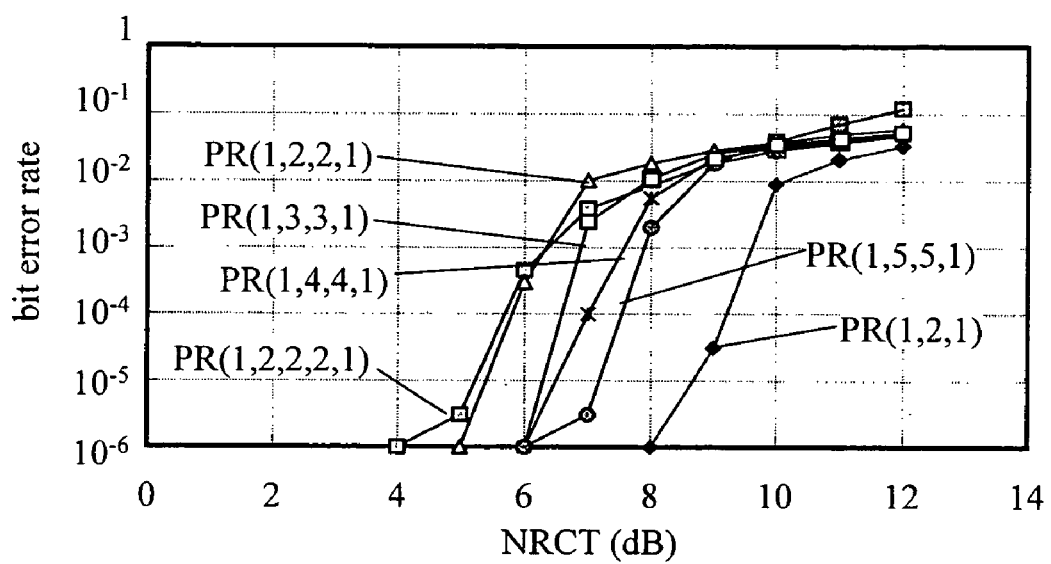
FIG. 11 is a diagram showing simulation results of the relationships between the normal resolution crosstalk amounts and the bit-error rates.

When the effects of the digital information reproduction method of the present invention are described later, detailed description will be given for PR (1, 2, 1) class, which has the smallest bit-error rate. For some other disc medium, however, PR (1, 2, 2, 2, 1) class is more suitable. The simulation results shown here are based on the calculation model shown in FIG. 4, so that the amplitude for the super-resolution signal component is substantially constant irrespective of the mark length. However, some other disc medium structures may possibly cause thermal interference and thermal response delay, which in turn may possibly decrease in the amplitude of the super-resolution signal component as the mark length becomes shorter. In this case, the use of a PR class that has large resolution for the 2 T signal—PR (1, 2, 1) is an example of such a PR class—requires a boost amount of the 2 T signal made larger by use of an equalizer. This results in a simultaneous increase in the amount of noise in a high-frequency range, and, consequently, a decrease in the S/N ratio as a whole takes place. For this reason, a PR class with zero amplitude of the 2 T signal, such as PR (1, 2, 2, 2, 1) class, is more suitable in this case. Incidentally, one of the essential features of the present invention is the discovery of the fact that bit errors occurring in a super-resolution optical disc are concentrated on certain edge patterns. As a consequence, bit error correction can be performed favorably by determining, from the bit-error patterns determined on the basis of the kind of disc medium and on the basis of the PRML class, patterns that are main causes for the error. This is another essential feature of the present invention. The PRML class employed for the reproduction has to be appropriately selected in accordance with the characteristics of the disc medium used for the purpose. The selection of the PRML class and the extraction of the characteristic patterns of bit errors can be done with ease according to the embodiment described thus far.

Figure 16A:
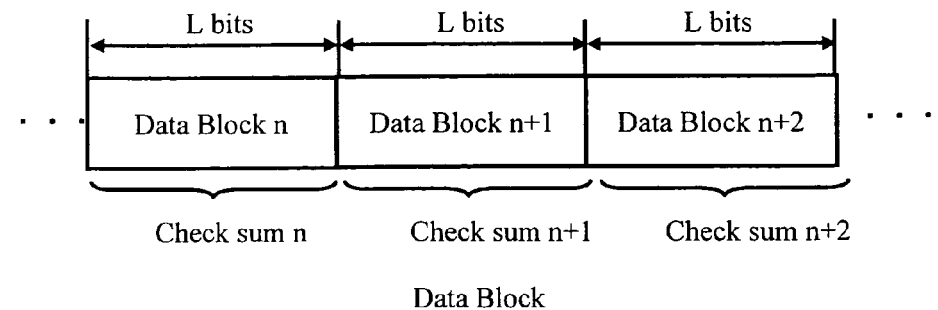
FIGS. 16A to 16C are diagrams showing the configuration of parity check codes of the present invention.
Figure 16B:
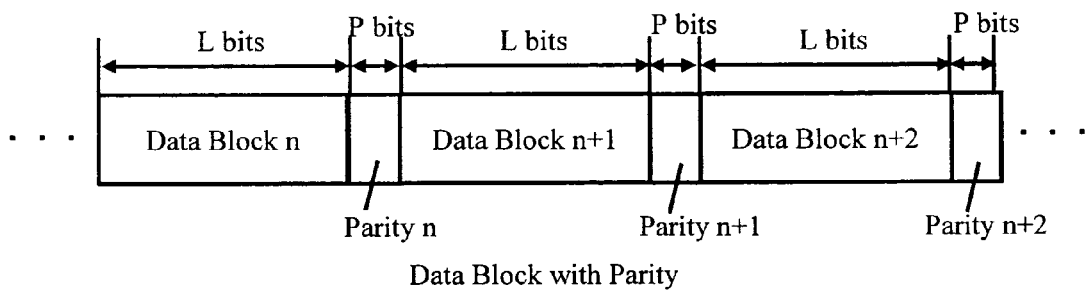
Figure 16C:
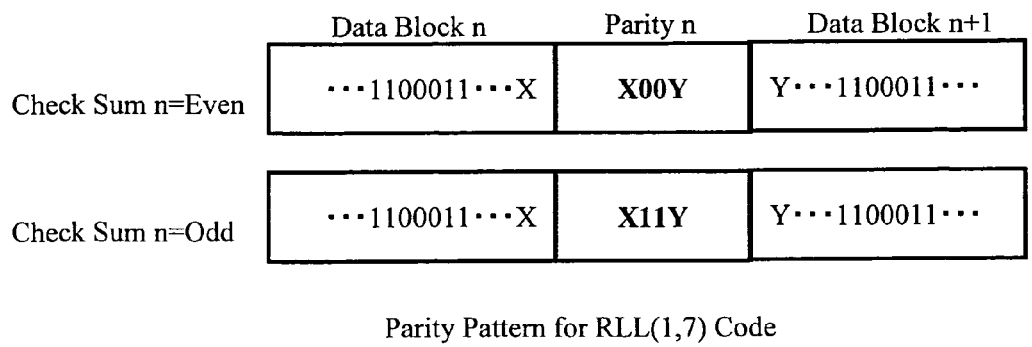

What will be described next is an embodiment of parity check codes in conformity with the run-length limited coding. FIGS. 16A to 16C are explanatory diagrams for showing the way of setting the parity check codes and the patterns of the parity check codes according to the embodiment of the present invention. The shortest run length is assumed to be 2 T. Here, the bit string formed on the disc is divided into blocks each of which has L bits, and, to each of the blocks, a parity check code of P bits are added. The simplest way to be used for the purpose is to use the number of "1" included in each L-bit data (check sum) as the information used for the parity code. As shown in FIG. 16C, a bit string of 4 bits is used as the parity code, and "X00Y" and "X11Y" are used so as to correspond respectively to the case where the check sum is an even number and the case where the check sum is an odd number. Here, each of the bits "X" and "Y" has a value of either "1" or "0" while "X" is the last digital value in the preceding data block and "Y" is the first digital value in the following data block. In this way, the limit of the shortest run length of 2 T can be met by the parity check code together with the preceding and the following data blocks. Likewise, conformity with the codes having the shortest run length of 3 T can be achieved by the use of "X000Y" and "X111Y" as parity check codes. In this embodiment, the use of check sum is shown as the simplest case. Alternatively, as shown in Technical Digest of Optical Data Storage 2003, TuB4, 4-bit data using generator polynomial g (x)=$1+x+x^2+x^4$ can be used as the data representing the parity check codes, for example. Details of these will not be given here, but these techniques are similar to the technique of the error detection codes (EDC) used for the format of optical discs. Accordingly, those skilled in the related technical field should be familiar with the generating method, the checking method, and the like.

What will be described next is the processing procedure for the digital information reproduction method of the present invention. The descriptions will be given using a flowchart and a circuit block diagram.

Figure 17:
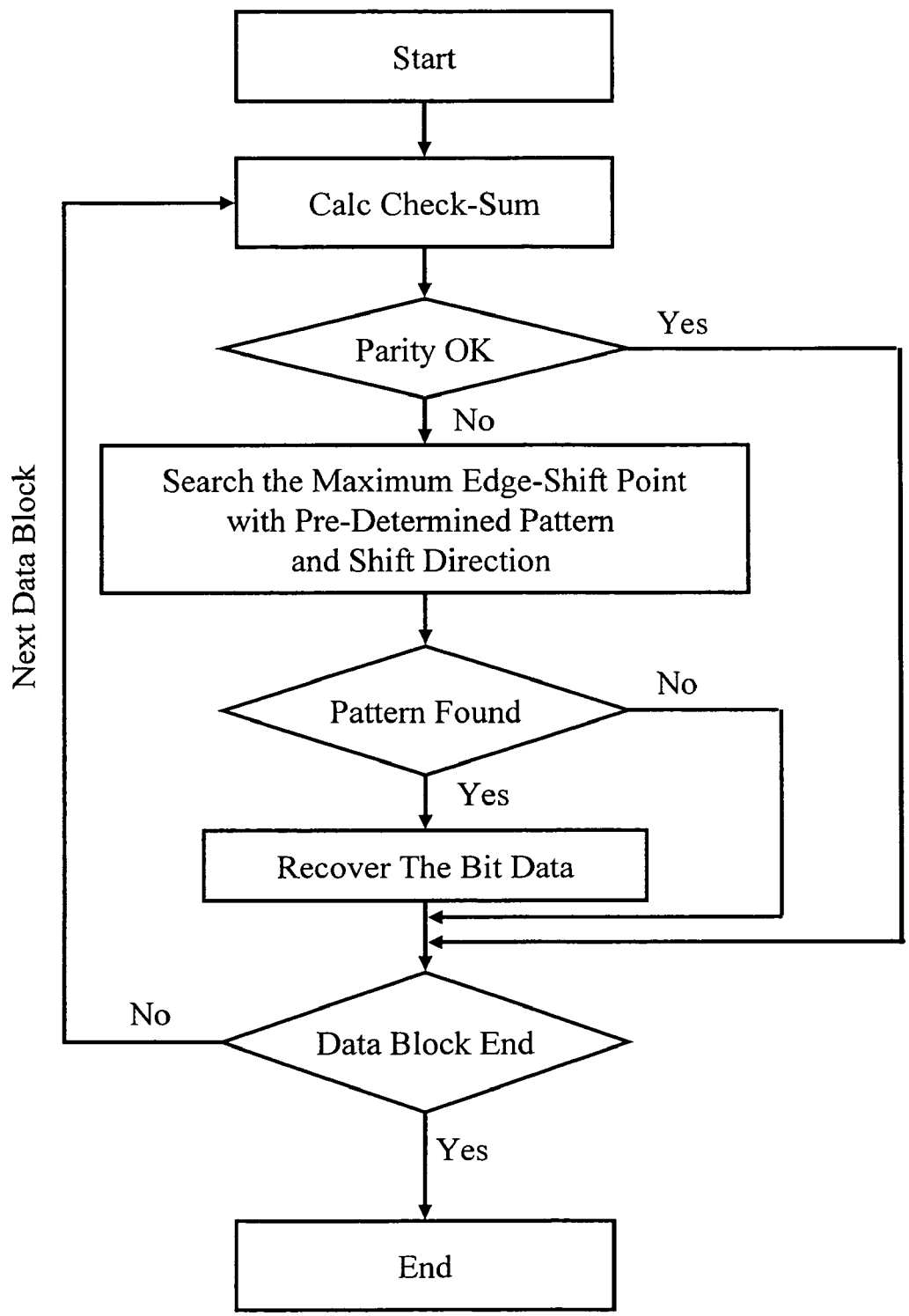
FIG. 17 is a flowchart showing an error correction method of the present invention.

FIG. 17 is a flowchart showing the processing procedure for the digital information reproduction method of the present invention. To begin with, for the block consisting of the data and the parity check code shown in FIG. 16B, the check-sum value for the data block is calculated. Then, a check is carried out whether the obtained check-sum value is matched with the result shown by the parity check code. When the checksum value is not matched with the result shown by the parity check code, a search is conducted, from the data patterns shown in FIG. 13, for the pattern with its edge shift being in a predetermined direction (note that since the edge is shifted to the left-hand side by the error, the edge-shift amount detected from the reproduction data is to the right-hand side) and with the magnitude of the edge shift being maximum. When a pattern that satisfies these conditions is found out, the bit in which the error most probably occurs can be uniquely identified, and the bit thus identified is then corrected. This kind of processing is repeated until the processing for the last data block is finished. In this way, an excellent parity check can be conducted with the pattern detection being highly accurately, that is, with the correction being highly reliable.

FIG. 1 is a block diagram showing a circuit configuration preferably employed to materialize a digital information reproduction method of the present invention. In FIG. 1, a reproduction signal 51 is converted into a binary data string 52 by a Viterbi decoder 21 in a reproduction signal processing circuit 20. A parity check circuit 22 checks the matching of the content of the data block with the content of the parity check code in accordance with the procedure shown in FIG. 17, and sends the results to a corrector 27. An edge detector 23 detects the leading and the trailing edges of record marks from the binary data string 52, and notifies an edge shift evaluator 24 of the edge positions. The edge shift evaluator 24 calculates the edge shift amount at each of the notified edge positions, and sends the results to a pattern determination unit 25. The pattern determination unit 25 identifies which of the patterns shown in FIG. 13 each of the leading and the trailing edges of the record marks of the binary data string 52 has. In addition, the pattern determination unit 25 extracts the patterns of high frequency of error occurrence, and determines the sign of the edge shift amount. When the pattern determination unit 25 determines that the pattern in question is a pattern of high frequency of error occurrence, the pattern determination unit 25 sends the edge position and the edge shift amount to a maximum edge shift selector 26. The maximum edge shift selector 26 selects an edge position that makes the edge shift amount maximum from certain predetermined patterns with their edge shifts being in the direction that is more likely to evoke an error. The results are sent to the corrector 27. In a case where the corrector 27 determines, on the basis of the determination results of the parity check circuit 22, that correction is necessary, and, concurrently, where the maximum edge shift selector 26 selects an effective pattern, the corrector 27 corrects the bit value of the edge in question. With this respect, the present invention assumes the use of V-SEAT described in Japanese Journal of Applied Physics Vol. 45, No. 2B, 2006, pp. 1213-1218 as a method of determining the edge shift amount in accordance with the data pattern and in a form based on Viterbi decoding. The edge shift amount can naturally be determined using the so-called jitter value or other evaluation indicators.

Here, a supplementary explanation will be given concerning the definition for V-SEAT. V-SEAT is the abbreviation for virtual-state-based-sequenced error for adaptive target. The description given here is limited to the case of a fixed target level of PRML for the sake of simplicity.

The measurement concept of edge shift in V-SEAT is as follows. Euclidean distances are measured between the reproduction signal and the target waveform for the correct binarized bit pattern as well as for the binarized bit pattern shifted by one bit from the correct one. The calculation of the Euclidean distance can be performed by adding the squared value of the difference between the reproduction signal and the target signal at each point of time.

Figure 23:
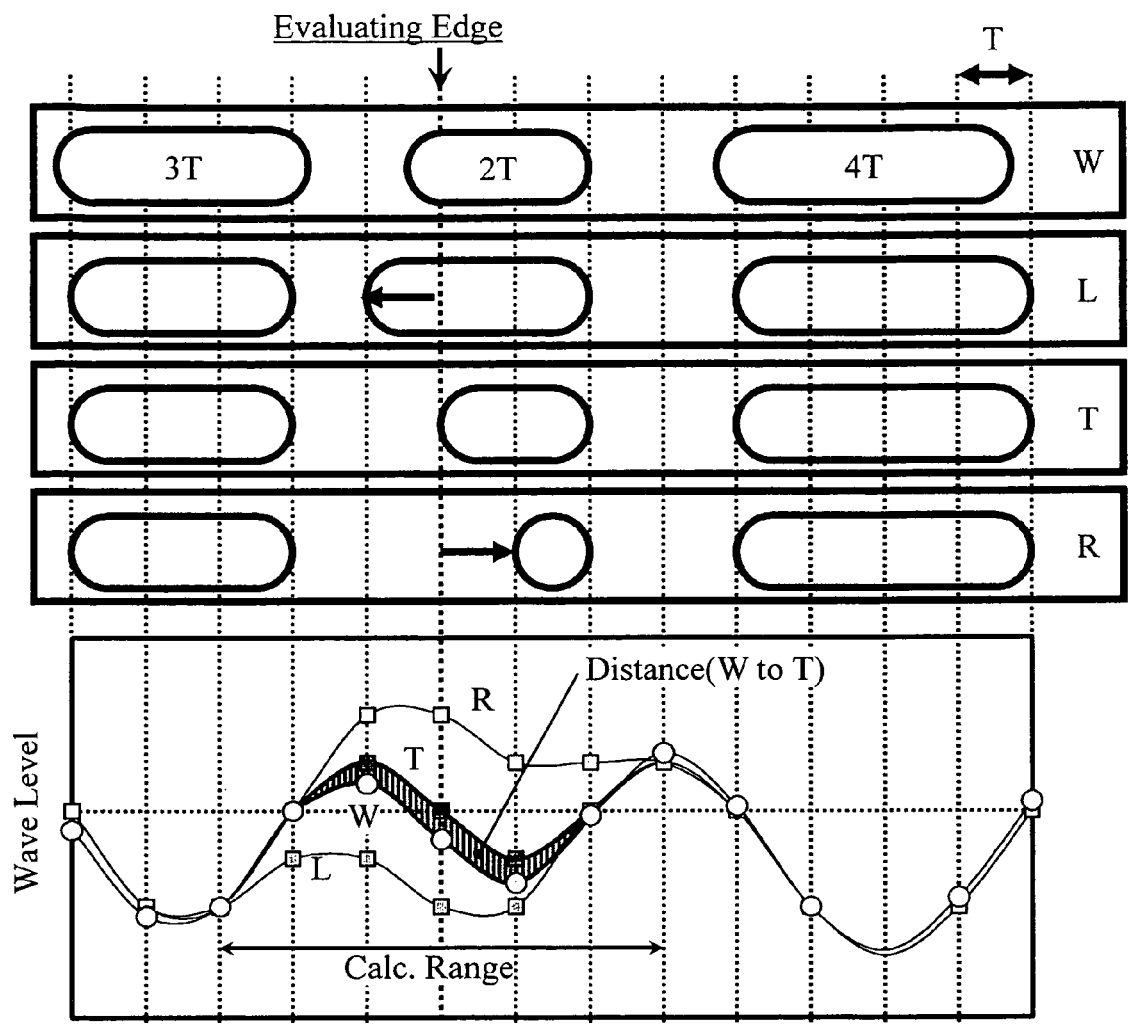
FIG. 23 is a diagram showing a calculation model of V-SEAT.

FIG. 23 shows the calculation model of V-SEAT. The record mark is represented by "W," the correct target mark is represented by "T," and the marks shifted by 1 T to the left-hand side and to the right-hand side from the correct target mark are represented respectively by "L" and "R" in FIG. 23. Here, the distance "W→T" corresponds to the edge shift amount and is normalized by the distance "L→T" or "R→T," which corresponds to the width of the detection window. These distances are calculated as Euclidean distances in accordance with the method of PRML. The distance thus calculated is called an extended edge shift D, which is defined by the following formula.

$$D(t_n) = \frac{SE(W, L, t_n) - SE(W, R, t_n)}{2} \quad (1)$$

In the above formula, $t_n$ is the point of time corresponding to the nth edge, and SE is a sequence error, which is calculated by the following formulas.

$$SE(W, L, t) = \frac{ED(W, L, t_n) - ED(W, T, t_n) - ED(L, T, t_n)}{2 \times ED(L, T, t_n)} \quad (2)$$

$$SE(W, R, t) = \frac{ED(W, R, t_n) - ED(W, T, t_n) - ED(R, T, t_n)}{2 \times ED(R, T, t_n)} \quad (3)$$

In the above formulas, W, T, L, R represent the reproduction wavelength or the target wavelength of the respective record marks. ED represents the Euclidean distance, and is calculated by the following formula.

$$ED(A, B, t_n) = \sum_i (A[t_n + i] - B[t_n + i])^2 \quad (4)$$

The extended edge shift D can be treated in a similar way in which the edge shift in the ordinary time direction, which is measured by a time interval analyzer or the like. Accordingly, the average edge shift and the jitter can be calculated by the following formulas.

$$\text{V-SEAT Shift: } \Delta = \frac{\sum_{n=1}^{N} D(t_n)}{N} \quad (5)$$

$$\text{V-SEAT Jitter: } \sigma = \sqrt{\frac{\sum_{n=1}^{N} (D(t_n) - \Delta)^2}{N}} \quad (6)$$

The method is characterized by the simultaneous use of the two targets L and R. These include the virtual state that is not subject to the run-length limits (in this case, 1 T).

Figure 24:
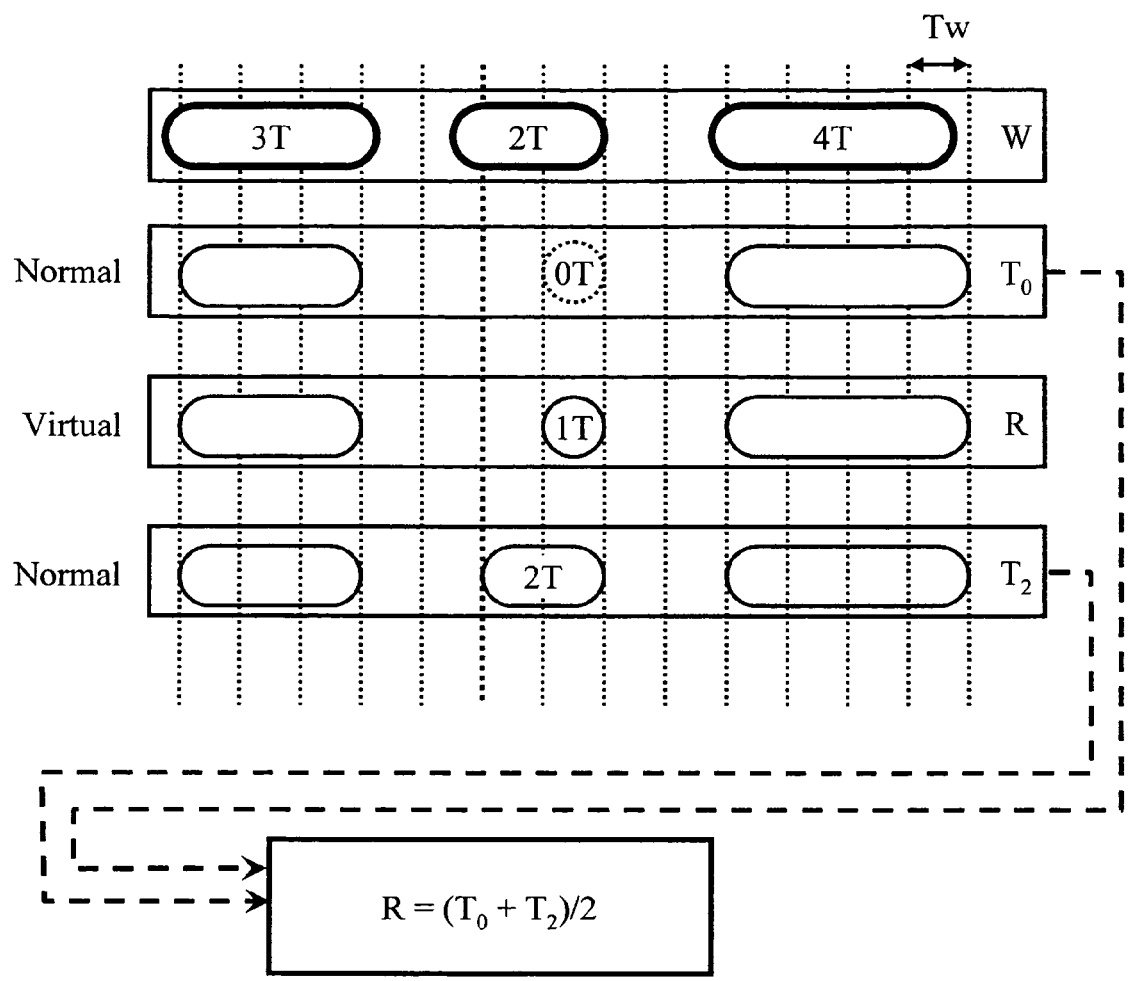
FIG. 24 is a diagram showing a calculation model of V-SEAT that is made compatible with the adaptive PRML.

V-SEAT is also compatible with the adaptive PRML, in which the target level of PRML adaptively follows the reproduction signal. The calculation results of PRML with the fixed target level alone are shown in the present invention, but similar processing is valid for the case of using the adaptive PRML. In this event, it is preferable that V-SEAT be also made compatible with the variable target level. In the case of using the adaptive PRML, the target signal level is calculated in the following way. FIG. 24 is a calculation model in the case of making V-SEAT compatible with the adaptive PRML. In the case of 1-7 modulation, the bit pattern "R" includes a virtual state including 1 T in FIG. 24. No target level that directly corresponds to such a bit pattern "R" exists in the PRML decoder, but, as shown in FIG. 24, can be calculated as the average level of the two bit patterns "$T_0$" and "$T_2$" which are subject to the run-length limit. The kind of perspective is based on the basic concept of PRML, in which the target signal level is calculated by the linear convolution of the PR class and the bit pattern.

What will be described next are some effects of the digital information reproduction method of the present invention.

Figure 18:
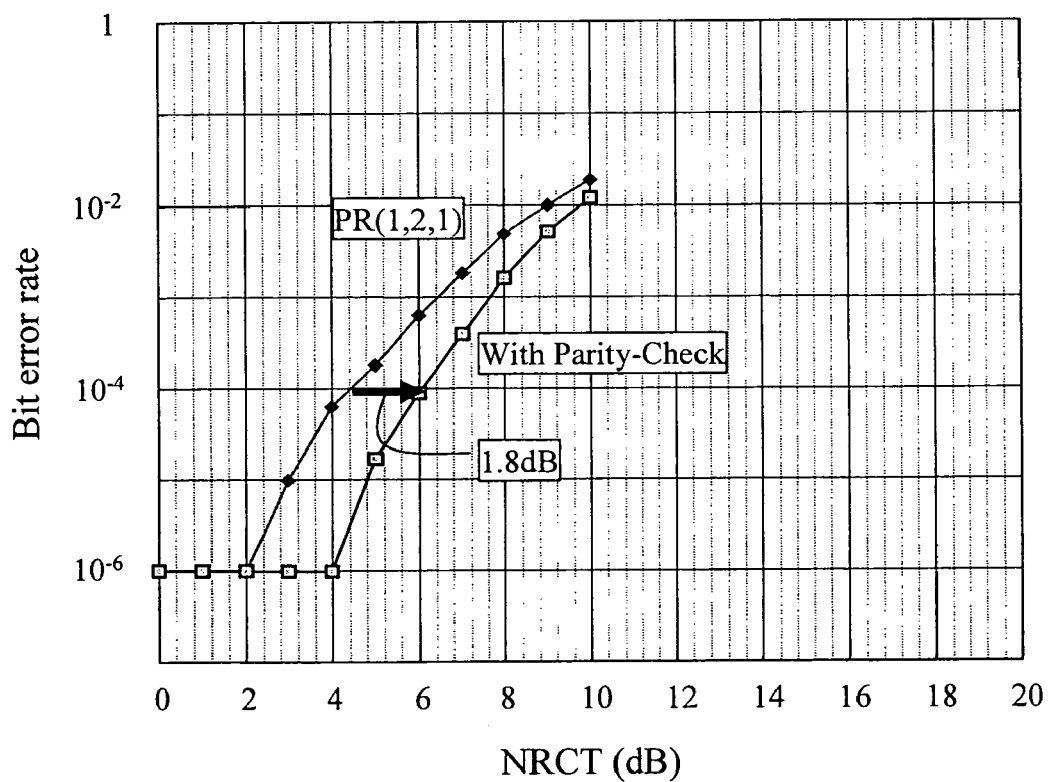
FIG. 18 is a diagram showing calculation results indicating the effects of the present invention on the improvement in the bit-error rate.

FIG. 18 shows the calculation results indicating the effects of decreasing the bit-error rate according to the digital information reproduction method of the present invention. Here, the configuration of the data blocks and the parity check codes shown in FIG. 16A to 16C are used. While each of the data blocks has a unit length L=69 bits, each of the parity check codes of P=4 bits is added to the data block. The calculation is performed on the same conditions that are employed in the calculations described above. The relationship between the NRCT value and the bit-error rate is evaluated for PR (1, 2, 1) class. Both the parity check and the correction are conducted following the same methods that are described above. According to the method of the present invention, approximately 1.8 dB gain can be obtained for the NRCT value.

Figure 19:
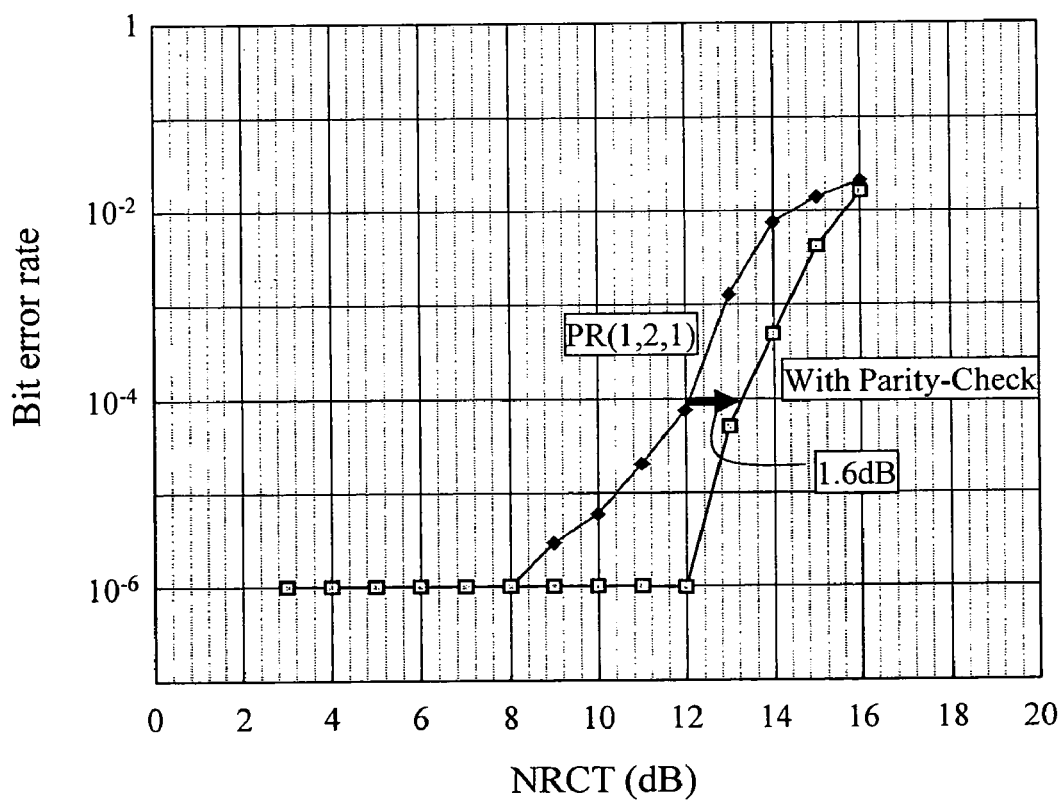
FIG. 19 is a diagram showing calculation results indicating the effects of the present invention on the improvement in the bit-error rate.

FIG. 19 shows the results of the same calculation as that shown in FIG. 18, but the calculation is conducted under the condition that the width of the detection window T=25 nm (equivalent to a capacity of 75 GB). When the bit-error rate is the same between the case in FIG. 19 and that in FIG. 18, the NRCT value in FIG. 19 is larger than the corresponding value in FIG. 18. This is because being higher-density makes the normal resolution signal component appear only in long marks and be less influential relatively. In this case also, approximately 1.6 dB gain can be obtained for the NRCT value according to the method of the present invention.

Figure 20:
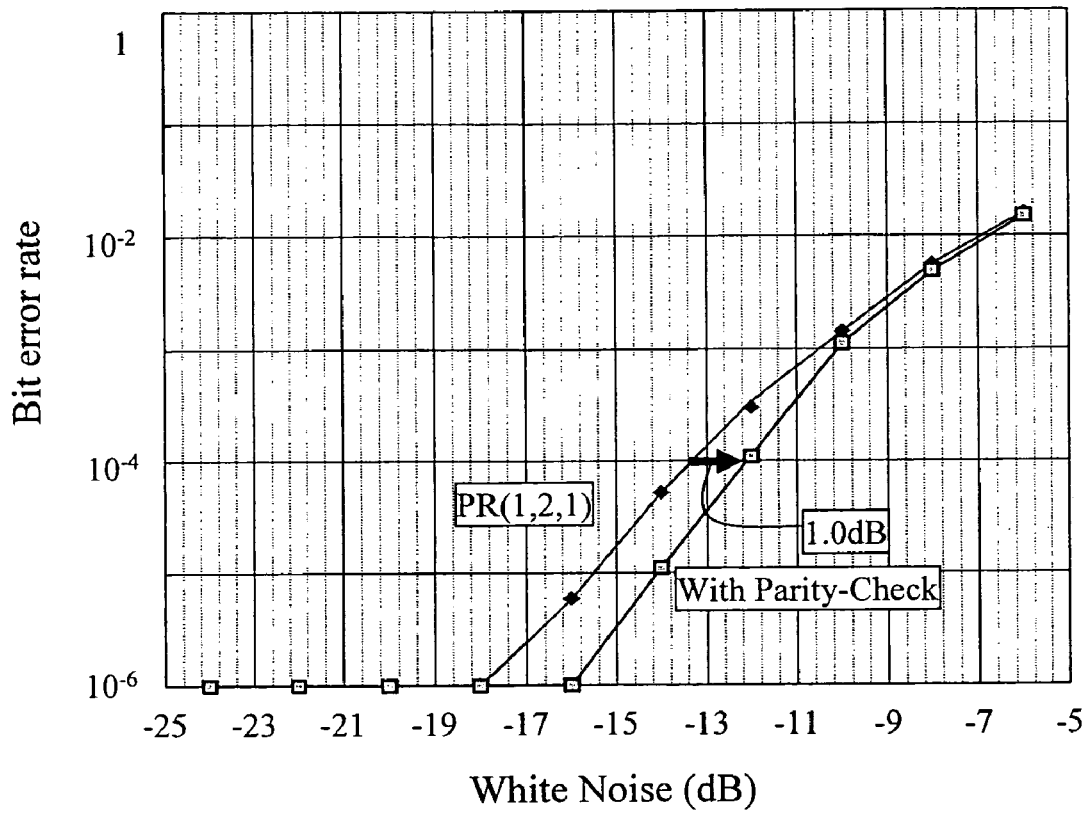
FIG. 20 is a diagram showing calculation results indicating the effects of the present invention on the improvement in the bit-error rate.

FIG. 20 shows the results of the calculation of the relationship between the white noise and the bit-error rate. The calculation is conducted under the condition of T=25 nm as in the calculation of FIG. 19, but the calculation here is conducted with NRCT value=±6 dB. Note that the increase of the white noise has random shift influence on the edge shift. With this respect, the method of the present invention has effects of decreasing the bit-error rate, and approximately 1.0 dB gain can be obtained for the white noise value.

Figure 21:
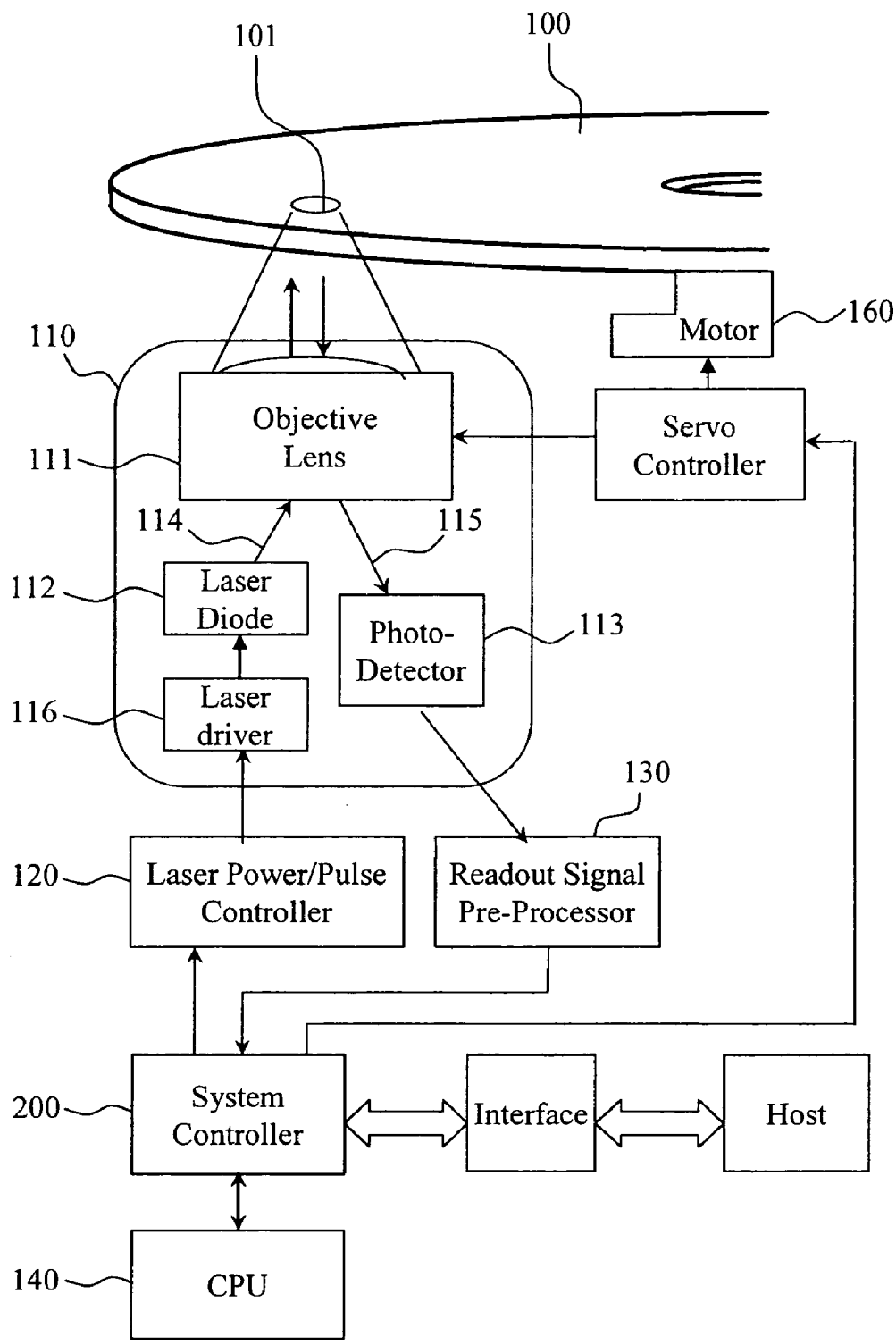
FIG. 21 is a schematic diagram showing a configuration example of an optical disc apparatus.

As the last one of the series of embodiments, descriptions will be given for a configuration of a preferable optical disc apparatus that is suitable for carrying out the present invention. FIG. 21 is a schematic diagram showing a configuration example of an optical disc apparatus with the digital information reproduction method of the present invention mounted thereon. An optical disc medium 100 that has been inserted into the apparatus is rotated by a spindle motor 160. At the time of reproduction, a laser beam 114 is generated while the current supplied to a semiconductor laser diode 112 is controlled by a laser power/pulse controller 120 via a laser driver 116 in an optical head 110. As a result of such control, the intensity of the laser beam 114 becomes the intensity instructed by a CPU 140. The laser beam 114 is condensed by an objective lens 111 and forms a beam spot 101 on the optical disc medium 100. Reflect light 115 coming from the beam spot 101 is detected by a photo-detector 113 via the objective lens 111. The photo-detector 113 consists of photo-detection elements that are divided into multiple units. A readout signal pre-processor 130 uses the signal detected by the optical head 110 and reproduces the information recorded in the optical disc medium 100. The present invention implemented as the circuit block shown in FIG. 1 is installed in a system controller circuit 200. The optical disc apparatus of the present invention with a configuration described above can thus reproduce data from a super-resolution disc.

The present invention relates to a data reproduction method for a large-capacity optical disc medium utilizing super-resolution effects, and is used for optical disc apparatuses that support the type of disc medium.

What is claimed is:

1. A method of reproducing digital information having a set of information bits of a length L and a set of parity check bits of a length P that are alternately arranged, both the information bits and the parity check bits conforming to rules for run-length limited coding, and the parity check bits representing check information obtained by a predetermined arithmetic operation conducted on the corresponding information bits, the method comprising the steps of:

checking up the matching between results obtained by the arithmetic operation conducted on the information bits and the check information represented by the parity check bits, the checking-up being conducted at the time of reproducing the information; and extracting a bit pattern with the highest probability of error from the information bits and then correcting the extracted bit pattern when the checking-up results in the mismatching between the two, wherein the bit pattern to be corrected is an edge portion in the information bit, that is, a portion where a switching between "1" and "0" occurs, the extraction of a bit pattern with the highest probability of error is carried out by the steps of:

extracting edge portions from the information bits;

identifying the bit pattern on the basis of the number of consecutive "0s" and the number of consecutive "1s" that precede and follow the edge portion, measuring the edge shift amount for each of the edge portions, checking-up the matching between the bit pattern and predetermined, registered bit patterns, determining whether each of the edge shift amounts has a sign that is identical to the sign of one of registered edge shifts defined for the respective registered bit patterns when the checking-up results in the matching between the bit pattern and the registered bit patterns, and extracting, from the information bits, a position of a bit pattern having the largest absolute value of the edge shift amount, from the bit patterns that are identical to the registered bit patterns and have the signs identical to the signs of the registered edge shifts, by holding the positions of bit patterns and the absolute values of the edge shift amounts of the information bits, when the signs of the edge shift amounts of the information bits are determined as identical to the signs of the registered edge shifts.

2. The method of reproducing digital information according to claim 1, wherein the shortest run length is 2 T (T is the width of the detection window) in accordance with the rules for the run-length limited coding, and while X represents a digital value equivalent to the last bit value of the information bits preceding the parity check bits, and Y represents a digital value equivalent to the first bit value of the information bits following the parity check bits, the parity check bits uses any of "X00Y" and "X11Y" according to information as to whether the number of "1s" included in the information bits preceding the parity check bits is an even number or an odd number.

3. The method of reproducing digital information according to claim 1, wherein the information bits "1" and "0" are formed as a physically-distinguishable mark and space in an information storage medium, and the registered bit patterns are a leading edge of a mark that is longer than the shortest run length and a trailing edge of a mark preceding a space that is longer than the shortest run length.

4. The method of reproducing digital information according to claim 1, wherein the information bits "1" and "0" are formed as a physically distinguishable mark and space in an information storage medium, and the registered bit patterns are a leading edge of a mark that is longer, by not less than 3 T (T is the width of the detection window), than the shortest run length and a trailing edge of a mark preceding a space that is longer, by not less than 3 T, than the shortest run length.

5. The method of reproducing digital information according to claim 1, wherein all of registered edge shift codes defined for the respective registered bit patterns are the same.

* * * * *